United States Patent [19]
Haller et al.

[11] Patent Number: 5,804,506
[45] Date of Patent: Sep. 8, 1998

[54] ACCELERATION OF ETCH SELECTIVITY FOR SELF-ALIGNED CONTACT

[75] Inventors: Gordon A. Haller; Randhir P. S. Thakur; Kirk Prall, all of Boise, Id.

[73] Assignee: Micron Technology, Inc.

[21] Appl. No.: 516,461

[22] Filed: Aug. 17, 1995

[51] Int. Cl.⁶ .................................................. H01L 21/461
[52] U.S. Cl. ........................... 438/649; 438/683; 438/705; 438/784
[58] Field of Search .................................. 437/200, 195, 437/228; 156/653.1; 438/649, 683, 705, 723, 743, 784

[56] References Cited

U.S. PATENT DOCUMENTS 5,324,974  6/1994  Liao .......................................... 257/344
5,571,733  11/1996  Wu et al. .................................... 437/34

*Primary Examiner*—Jey Tsai
*Assistant Examiner*—C. Everhart
*Attorney, Agent, or Firm*—Reed Smith Shaw & McClay

[57] ABSTRACT

A method of fabricating an integrated circuit on a semiconductor substrate is provided including the steps of forming a tungsten silicide conductor structure having a nitride encapsulating layer on the substrate and disposing a doped nonconducting layer over the conductor structure. A self-aligned contact etch is performed wherein the etch is a selective etch of the conductor structure and the nonconducting layer. The selective etch preferentially removes material forming the nonconducting layer rather than material forming the conductor structure. The semiconductor layer is preferably doped with germanium but may also be doped with phosphorous or other known dopants. A germanium concentration of 5% to 25% provides the preferred increased selectivity of the etch. The nonconducting layer can be formed of SG, BPSG, BSG, PSG and TEOS. Transistor regions are formed in the substrate in the vicinity of the tungsten silicide structure and electrical contacts are electrically coupled to the transistor regions by way of openings provided with the selective etch.

20 Claims, 8 Drawing Sheets

ACCELERATION OF ETCH SELECTIVITY FOR SELF-ALIGNED CONTACT

This invention relates to the field of semiconductor integrated circuit fabrication and, in particular, to a process for formation of self-aligned contacts during semiconductor integrated circuit fabrication.

BACKGROUND OF THE INVENTION

Semiconductor integrated circuits are chemically and physically integrated into substrates, such as a silicon wafer, by patterning layers and regions in the substrate. The patterned layers and regions can be formed of different conductivity type materials in order to form the active regions of transistors and diodes. The patterned layers and regions can also be formed of conductive and nonconductive materials. The conductive materials may be used to provide lead lines and resistors for the integrated circuit. The lead lines are preferably formed of a highly electrically conductive material such as a metal.

Specifically, the lead lines, or conductors, may be used to connect the various components that are formed in the surface of the integrated circuits. Such conductors are commonly known as "lines" or "runners". Conductors suitable for these purposes may be formed by depositing, masking and etching a doped polysilicon layer atop a $SiO_2$ layer on a doped silicon substrate.

As integrated circuits decrease in size current speed along the conductive runners becomes a critical issue. One way of increasing the current speed of polysilicon runners is depositing a more highly conductive metal silicide layer upon the polysilicon runner in electrical contact with the polysilicon runner. Such a layered polysilicon runner has a lower total resistance than a polysilicon runner without the metal silicide.

Various refractory metals and their silicides are used in this manner in the prior art. One silicide that is of particular interest in this respect is tungsten silicide. In particular, tungsten silicide is very useful in forming conductive leads. Tungsten silicide, generally in the form $WSi_x$, can be used in the formation of integrated circuits both as an intermediate barrier and as a conducting film. Among the useful properties of tungsten silicide are its low bulk resistance and its low stress.

Chemical vapor deposition (CVD) is commonly used in the deposition of tungsten silicide. In general, CVD is favored over other methods of depositing tungsten silicide, such as sputtering technology. Films deposited by CVD have lower levels of impurities and better step coverage than films formed with other methods.

When a CVD method is used to deposit tungsten silicide the reaction chemistry is typically based on the reaction of a silicon source gas, such as silane ($SiH_4$), with a reactant gas, such as tungsten hexafluoride ($WF_6$). An additional advantage of a CVD process using this reaction chemistry for depositing tungsten silicide is that relatively low process temperatures may be used because of the high reactivity of the silane and tungsten hexafluoride. The deposition temperatures may typically be in the range of approximately 250° to 500° C. A disadvantage of CVD process for deposit tungsten silicide using this reaction chemistry may be high levels of fluorine impurities in the deposited film.

When tungsten silicide leads are formed, they are often covered with a glass layer such as a BPSG layer. When it is necessary to make electrical contact with regions in the vicinity of a tungsten silicide structure, an etch must sometimes be performed through the glass in the vicinity of the tungsten silicide structure. In order to perform the process step of etching the glass near the tungsten silicide structure a selective etch must be performed.

For example, if the tungsten silicide structure is encapsulated with a nitride layer, the selective etch must remove the glass of the glass layer more quickly than it removes the nitride of the nitride layer. Selective etches of the prior art may remove approximately one-half of the nitride layer while removing the required amount of glass. This was acceptable in the prior art because the remaining half of the nitride layer had enough structural integrity to encapsulate the tungsten silicide structure. For example, it was common for a nitride layer to have a thickness of sixteen hundred angstroms before the selective etch. When a nitride thickness of eight hundred angstroms remained after the etch the encapsulating layer was still adequate.

However, in the smaller chip technologies using this type of selective etch may not leave enough nitride after removing the glass when the etch has that amount of selectivity. This is because in the smaller chip technologies it is common to have encapsulating nitride layers having a thickness of only eight hundred angstroms before the etch. If one-half of this starting thickness is removed the remaining nitride thickness is not satisfactory.

Briefly stated, the invention is a method for fabricating integrated circuits on a semiconductor substrate wherein a self-aligned contact is formed. A layer of nonconducting material, such as BPSG, is disposed over an encapsulated tungsten silicide conductor and contact regions on both sides of the tungsten silicide conductor are etched through the nonconducting layer. A selective etch is used wherein the material forming the nonconducting layer is removed by the etchant at a much higher rate than the nitride material encapsulating the tungsten silicide conductor. The selectivity of the etch is increased by optimally doping the BPSG material of the nonconducting layer with boron and phosphorous and doping the BPSG material with germanium.

In view of the above described state of the art, the present invention seeks to realize the following objects and advantages.

It is an object of the present invention to provide a method for selectively etching a semiconductor substrate in order to provide electrical contact with semiconductor structures below a glass layer.

In particular, it is an object of the present invention to provide a method for etching a glass layer and a nitride layer of a semiconductor substrate with increased selectivity.

These and other objects and advantages of the invention will become more fully apparent from the description and claims which follow or may be learned by the practice of the invention.

SUMMARY OF THE INVENTION

A method of fabricating an integrated circuit on a semiconductor substrate is provided including the steps of forming a tungsten silicide conductor structure having a nitride encapsulating layer on the substrate and disposing a doped nonconducting layer over the conductor structure. A self-aligned contact etch is performed wherein the etch is a selective etch of the conductor structure and the nonconducting layer. The selective etch preferentially removes material forming the nonconducting layer rather than material forming the conductor structure. The nonconducting layer is preferably doped with germanium. A germanium concentration of 5% to 25% in the nonconducting layer provides the preferred increased selectivity of the etch.

BRIEF DESCRIPTION OF THE DRAWINGS

In order that the manner in which the above-recited and other advantages and objects of the invention are obtained can be appreciated, a more particular description of the invention briefly described above will be rendered by reference to a specific embodiment thereof which is illustrated in the appended drawings. Understanding that these drawings depict only a typical embodiment of the invention and are not therefore to be considered limiting of its scope, the invention and the presently understood best mode thereof will be described and explained with additional specificity and detail through the use of the accompanying drawings.

DETAILED DESCRIPTION OF THE INVENTION

Figure 1A:
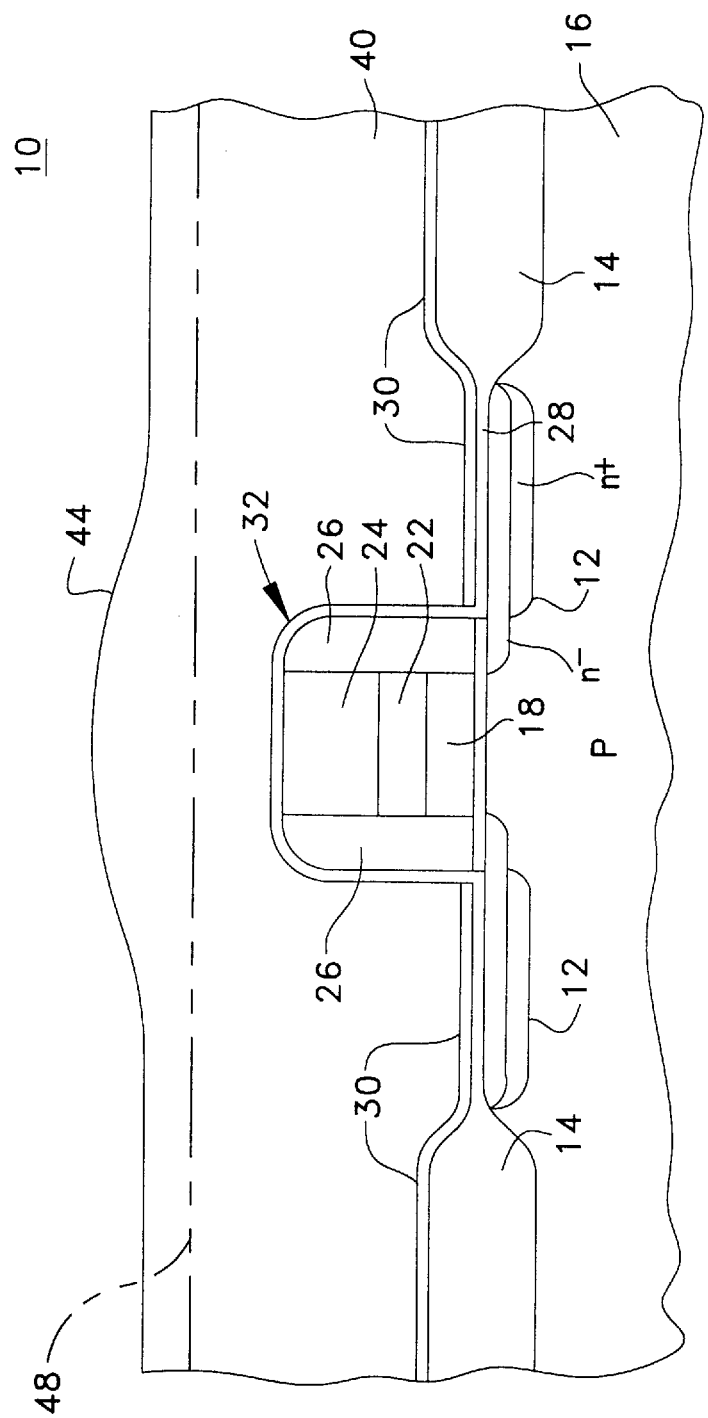
FIGS. 1A–1F are cross-sectional representations of the steps of an integrated circuit fabrication process including the method of the present invention.

Referring now to FIGS. 1A–1F, there is shown a semiconductor fabrication process performed upon a semiconductor substrate 10 in accordance with the structure and method of the present invention. Beginning with conventional active area formation on a silicon layer 16 of the semiconductor substrate 10, field oxide regions 14 are formed in a manner well known to those skilled in the art of semiconductor fabrication. Using conventional masking and etching steps an integrated circuit conductor structure, or lead line structure, is fabricated. In the fabrication of the conductor structure, a polysilicon layer 18 and a tungsten silicide layer 22 are formed. The layers 18, 22 form a conductor of a type commonly used to electrically connect various devices within semiconductor integrated circuits.

A nitride cap 24 having a thickness of about seven hundred to three thousand angstroms is formed above the tungsten silicide layer 22 of the semiconductor substrate 10. It will be understood by those skilled in the art that the nitride cap 24 may serve as a self-aligned mask to form the masked layers 18, 22. In one embodiment of the present invention the nitride cap 24 may also serve as an etch stop during a subsequent planarization step. A nitride spacer 26 is formed on each side of the masked layers 18, 22 and 24. The nitride spacers 26 may have a thickness in the range of five hundred to fifteen hundred angstroms. A typical thickness of the nitride spacers 26 may be approximately seven hundred angstroms.

Dopants are implanted into the silicon layer 16 below the nitride spacers 26 and along the bottom edges of the nitride spacers 26 in a conventional forms doped manner. The dopant implantation regions 12 in the silicon layer 16. The doped regions 12 in the vicinity of the nitride spacers 26 may form the elements of integrated circuit transistors. It is known that the dopants implanted to form the doped regions 12 can subsequently migrate out of the doped regions 12 and that contaminants can migrate into the doped regions 12 during later fabrication steps. Therefore, the doped regions 12 can be protected with a thin nitride layer 30 in order to prevent such migration. The protecting layer 28 may also be formed of an oxide.

An encapsulating nitride layer 30 is formed above the surface of the semiconductor substrate 10 to encapsulate the masked layers 18, 22 and the nitride structures 24, 26. The thickness of the encapsulating nitride layer 30 may be approximately a few hundred angstroms. A typical thickness for the encapsulating nitride layer 30 may be one hundred angstroms. The masked layers 18, 22, the nitride structures 24, 26 and the encapsulating nitride layer 30, form a nitride tungsten silicide structure 32.

A nonconductive layer 40 is formed over the semiconductor substrate 10, including the doped regions 12 and the tungsten silicide structure 32. The nonconductive layer 40 is preferably formed of a glass such as BPSG which may be a range of approximately ten to twenty thousand angstroms thick. After deposition of the BPSG layer 40, it may be heated to approximately 1000° C. for approximately twenty seconds. This heating step permits any gas bubbles which may be in the material forming BPSG layer 40 to be driven off. It also densifies and flows the layer 40. It will be understood that other types of heating steps may be performed to achieve these results.

The deposition of the BPSG layer 40 is a somewhat conformal process. Therefore a small mound 44 of BPSG material may form over the nitride tungsten silicide structure 32. The mound 44 of BPSG material is shown in FIG. 1A. In order to remove the mound 44 and level the rest of the layer 40 rapid temperature processing reflow may be performed following the BPSG deposition. A chemical mechanical planarization may also be performed in order to provide a level upper surface 48 upon the BPSG layer 40. In one embodiment of the method of the present invention, planarization may continue all the way down to the top of the tungsten silicide structure 32 and a new deposition of BPSG may be performed. The planarization may include polishing back the layer 40 using a CMP process stopped by nitride layer 30.

Figure 1B:
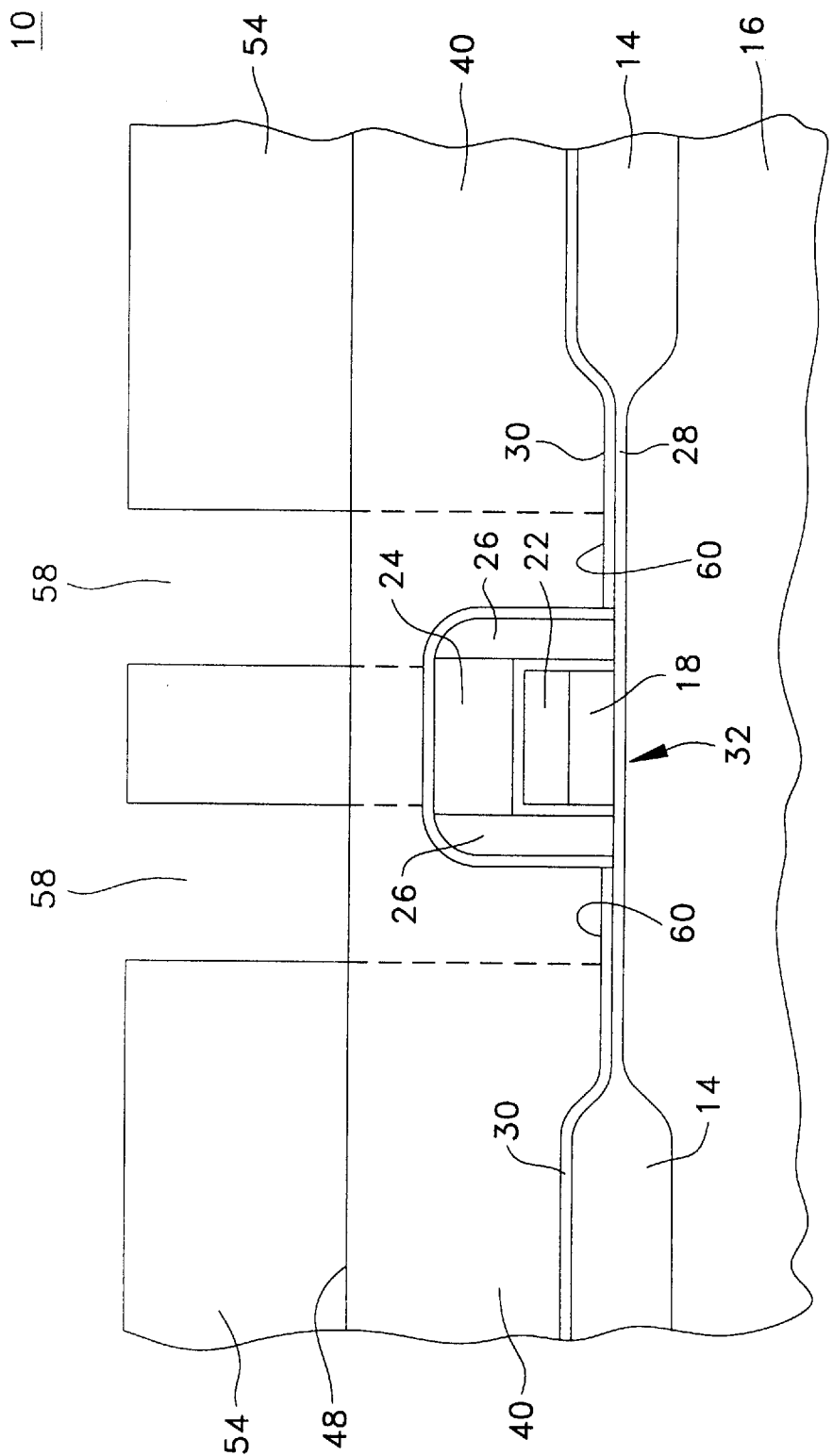

In order to make electrical contact with the doped regions 12 in the silicon layer 16 below the BPSG glass layer 40 in the vicinity of the tungsten silicide structure 32, an etching operation must be performed. In the etching operation a contact region 60 on each side of the nitride tungsten silicide structure 32 is removed. The contact regions 60 are shown in FIG. 1B. In order to simplify the drawings, the doped regions 12 are not shown in the remaining drawings. A photoresist masking layer 54 is then formed over the BPSG layer 40 respective mask opening 58 above each contact region 60 along the sides of the nitride tungsten silicide structure 32 in order to etch regions 12.

Figure 1C:
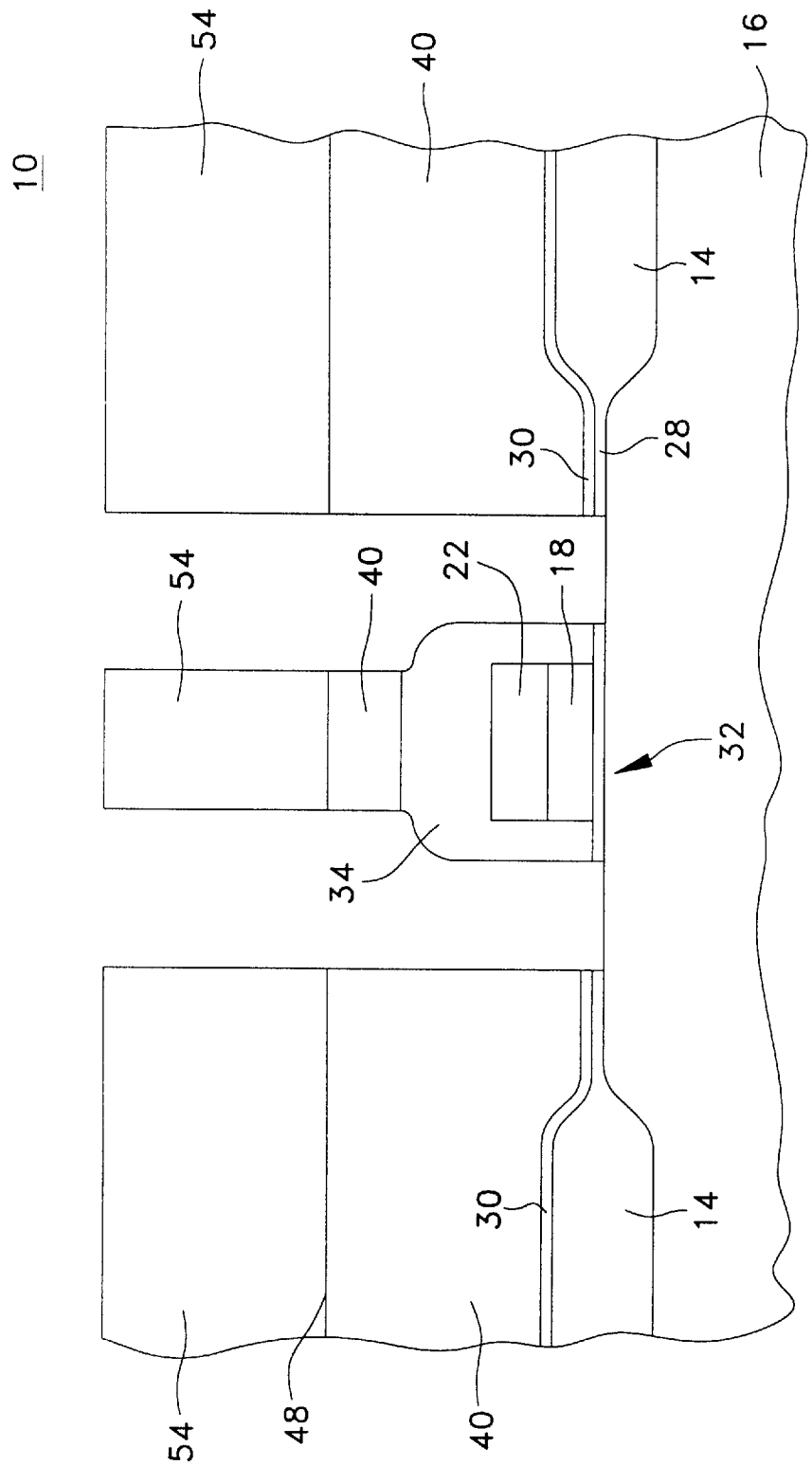

A plasma etch or a reactive ion etch of the BPSG layer 40 is performed using the masking layer 54 in order to remove the contact regions 60 of the BPSG layer 40. During the masked etch an etchant is applied to the BPSG layer 40 by way of the mask openings 58. The removal of the contact regions 60 begins at the upper surface 48 of the BPSG layer 40 and continues down to the bottom of the BPSG layer 40. The semiconductor substrate 10 after the removal of the contact regions 60 of the BPSG layer 40 is shown in FIG. 1C. In the representation of FIG. 1C, a single nitride region 34 is illustrated surrounding the layers 18, 22 rather than the nitride cap 24 and the nitride spacers 26 in order to simplify the drawing.

In order to remove the contact regions 60, the etchant comes in contact with the BPSG material of the layer 40 as well as the material of the nitride layer 30 which encapsulates the nitride tungsten silicide structure 32. It will be understood by those skilled in the art that it is necessary for the etchant to remove the BPSG material of the layer 40 as quickly as possible while removing as little as possible of the encapsulating nitride layer 30 over the tungsten silicide structure 32. Thus, the preferred process has a high BPSG etch rate and a low nitride etch rate.

For example, the encapsulating nitride layer 30 may have a thickness of approximately one hundred angstroms prior to the removal of the contact regions 60 of the BPSG layer 40 as previously described. After removal of the contact regions 60 using the prior art methods the portions of the nitride layer 30 in contact with the etchant may have a thickness of only one-half of the starting amount. In the technology for fabricating smaller integrated circuits the encapsulating nitride layer 30 may have a starting thickness of substantially less than the starting thickness of the prior art. If half of this starting thickness is removed the nitride layer 30 may not have the structural integrity required to serve as an encapsulating layer for a SAC etch contact.

It will be understood that as integrated circuits continue to shrink, and as nitride tungsten silicide structures 32 are formed closer to each other, the contact regions 60 of the BPSG layer 40 will become increasingly narrow. As the contact regions 60 become increasingly narrow it becomes increasingly difficult for etchants to effectively reach the lower portions of the contact regions 60 and provide a suitable selective etch down to the surface of the semiconductor substrate 10 along the sides of the tungsten silicide structure 32.

Thus the selectivity of the etching process for removing the contact regions 60 must be as high as possible. High selectivity permits the material forming the BPSG layer 40 to be removed at a rate many times higher than the rate at which the material of the encapsulating nitride layer 30 is removed. It is known in the art of semiconductor fabrication to increase the selectivity of the etch of the contact regions 60 by decreasing the rate at which a plasma or reactive ion etch removes the encapsulating nitride layer 30. However, in accordance with the method of the present invention, the selectivity of the etch of the contact regions 60 is increased by increasing the etch rate of the layer 40. The increased etch rate of the material of the layer 40 is provided by optimally doping the material forming the layer 40. The doping increases the rate at which a plasma or reactive ion etch removes the BPSG material forming the layer 40 with respect to the rate at which it removes the nitride of encapsulating nitride layer 30. The dopant is added to the material of the layer 40 at the time of the deposition of the layer 40 upon the semiconductor substrate 10.

It has been determined that etch rates sufficient to substantially increase the selectivity of etching in the required manner may be obtained by using germanium as the dopant and using the nonconducting materials typically used to form the layer 40. For example, substantially increased etch selectivity is obtained by doping SG, BPSG, BSG and PSG with germanium to provide the doped nonconducting layer 40. In these cases the layer 40, including the etched regions 60, is formed of GeSG, GeBSG, and GePSG and GePBTEOS respectively. Each of the resulting materials suitable for forming the layer 40 has a significantly increased etch rate.

In particular, it has been determined that the use of germanium in combination with BPSG and PBTEOS films provides at least a twenty-five percent faster dry etch rate and a two and one-half times faster wet etch rate. Additionally, germanium in combination with BPSG and PBTEOS films provides faster chemical mechanical planarization rates. The etch rate improvements are useful for enabling the 0.25 um process semiconductor fabrication technology.

Table I shows some of the increased etch rates which may be obtained in accordance with the method of the present invention. The five rows of the table represent data collected for varying concentrations of germanium within a glass film formed of GeBPSG. The last four rows of the table set forth substantially increased dry etch rates and substantially increased wet etch rates compared with the first row which represents a zero concentration of germanium.

TABLE I

| Ge % | B % | P % | DRY ETCH RATE | WET ETCH RATE |
|---|---|---|---|---|
| 0.00 | 4 | 7 | 105.0 | 494 |
| 17.91 | 3 | 5 | 163.0 | 2802 |
| 9.47 | 3 | 5 | 144.0 | 1018 |
| 13.79 | 3 | 5 | 151.5 | 1591 |
| 4.59 | 3 | 5 | 119.5 | 749 |

Figure 1D:
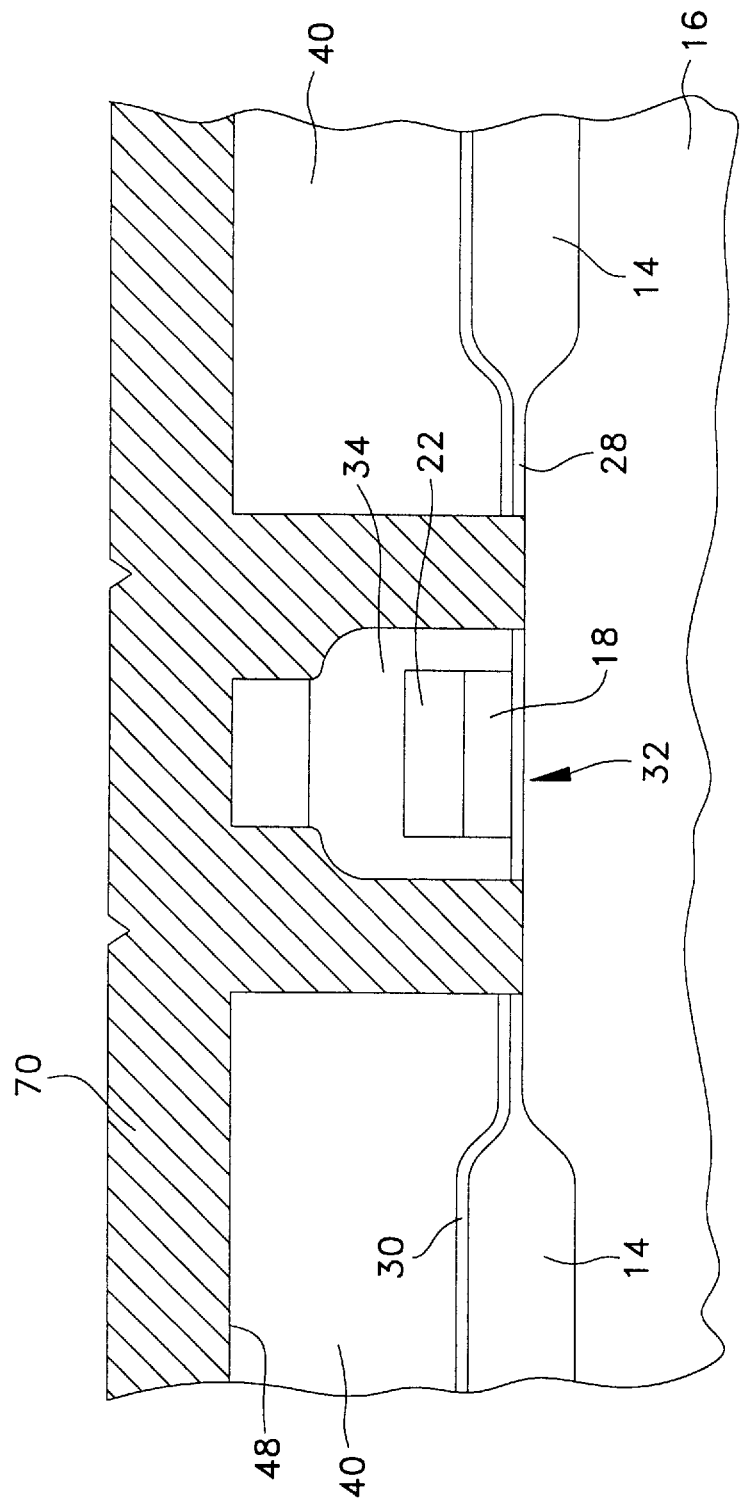
Figure 1E:
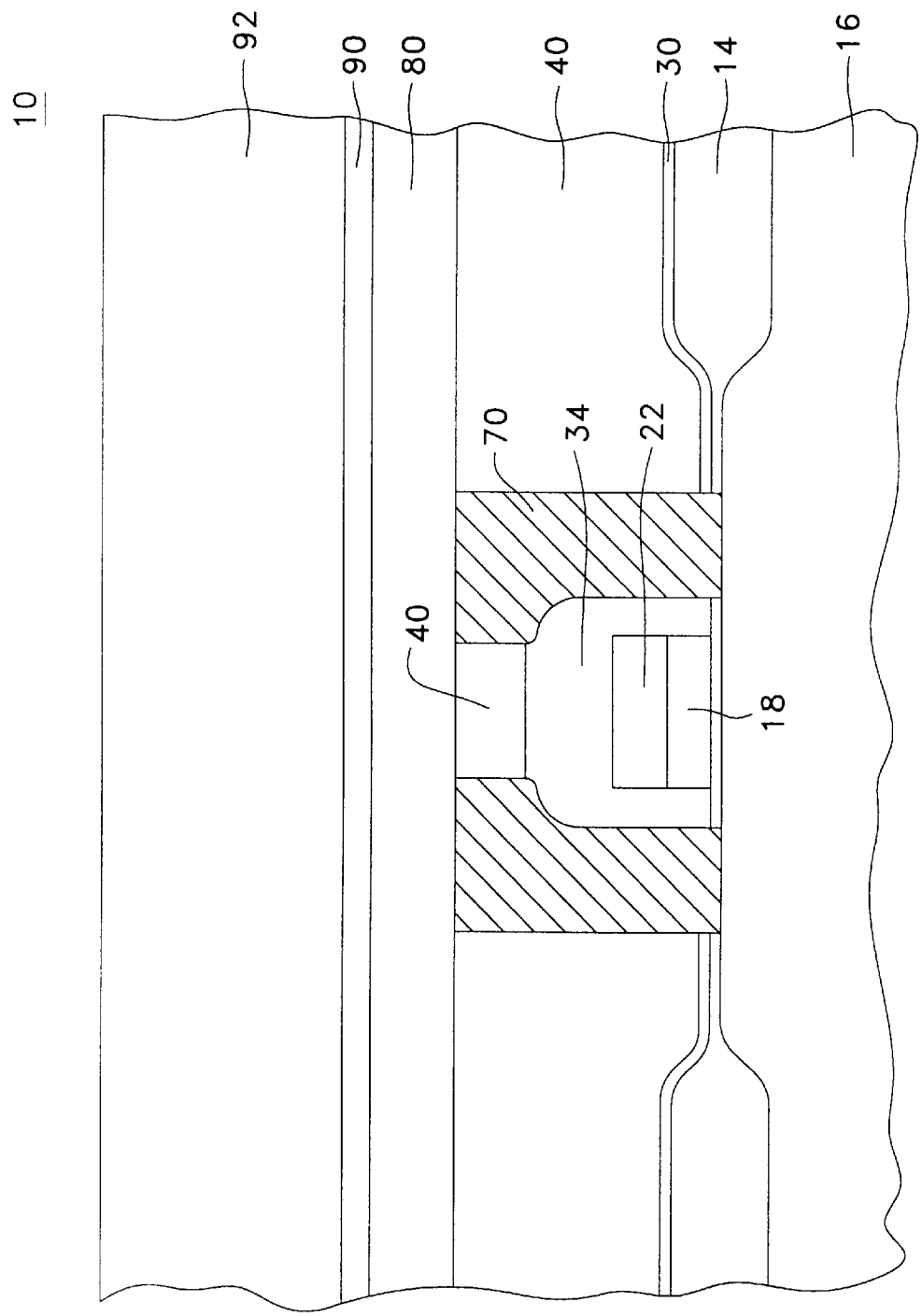

After the removal of the contact regions 60 is complete, any conventional fabrication process can be performed. For example the photoresist masking layer 54 may be removed and a layer 70 of polysilicon doped with phosphorus or boron may be deposited over the surface of the semiconductor substrate 10 as shown in FIG. 1D. Layer 70 may also be formed of any other conductor, for example, aluminum, tungsten, etc. The layer 70 fills the spaces where the contact regions 60 of the GeBPSG layer 40 were removed and covers the remainder of the GeBPSG layer 40. A chemical mechanical planarization or etch back planarization may then be performed in order to level both the GeBPSG layer 40 and the polysilicon layer 70 as shown in FIG. 1E. Conventional contacts and metalization can be used to complete the structure. The process can be completed by conventional metalization and dielectric technologies. For example the substrate may be covered by a dielectric layer 80.

Figure 1F:
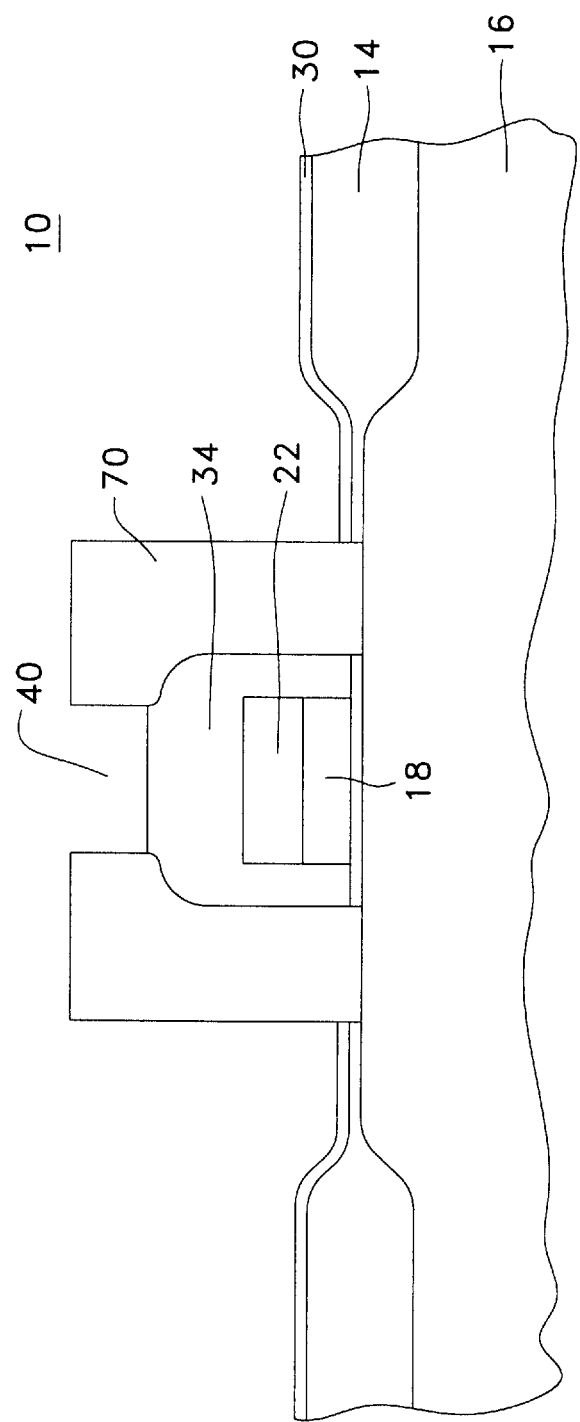

In one embodiment of the present invention, the GeBPSG layer 40 is removed as shown in FIG. 1F and replaced with a new layer of BPSG (not shown). This operation is sometimes performed because the BPSG material doped with germanium may be subject to moisture and cracking problems. When the GeBPSG material of the layer 40 is removed in this alternate embodiment a polysilicon plug 70, electrically coupled to the doped regions 12, remains where the contact regions 60 were removed. New BPSG is then deposited over the semiconductor substrate 10.

As previously described, the etch of the contact regions 60 must be as selective as possible with as much of the BPSG material of the contact regions 60 as possible being removed while as little as possible of the nitride of the nitride layer 30 encapsulating the tungsten silicide structure 32 is removed. Thus, it is useful to consider the selectivity ratio of the etch wherein the selectivity ratio is understood to refer to the ratio of the removed BPSG material of the contact regions 60 to the removed nitride material of the encapsulating nitride layer 30 during a unit period of time. When the BPSG material of the contact regions 60 is doped in accordance with the method of the present invention the selectivity ratio is approximately fifty to one at the top of the contact regions 60. The selectivity ratio is approximately thirty-five to one toward the bottom of the contact regions 60 under these circumstances. When the BPSG layer 40 is not doped in accordance with the present invention the selectivity ratio for the etch is less than approximately ten to one at the top of the contact regions 60.

Figure 2:
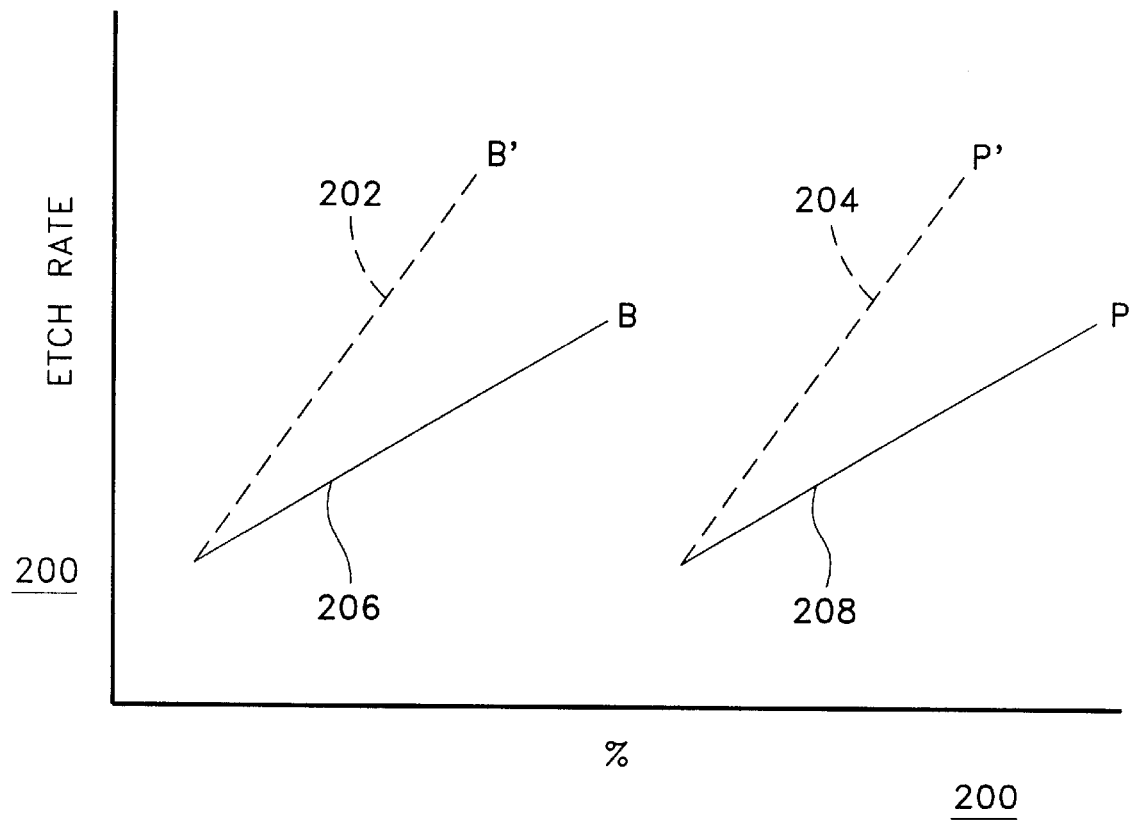
FIG. 2 shows a graphical representation of the relationship between the germanium concentration of a glass layer and etch rates of the glass layer.

Referring now to FIG. 2, the schematic graphical representation 200 illustrates the relationship between the etch rate of the layer 40 and the boron and phosphorous concentrations within the layer 40. The graphical representation 200 also shows how these relationships change when the layer 40 is doped with germanium. Lines 206, 208 of the graphical representation 200 illustrate how the etch rate of the BPSG layer 40 increases with increased concentrations of boron and phosphorus, respectively. Lines 202, 204 of the graphical representation 200 illustrate the relationship between the etch rate of a BPSG layer 40 having a higher germanium concentration and the boron and phosphorous concentrations. It will be understood that the graphical representation 200 illustrates a higher etch rate for the same amount of boron and phosphorus when the concentration of germanium is increased.

Figure 3:
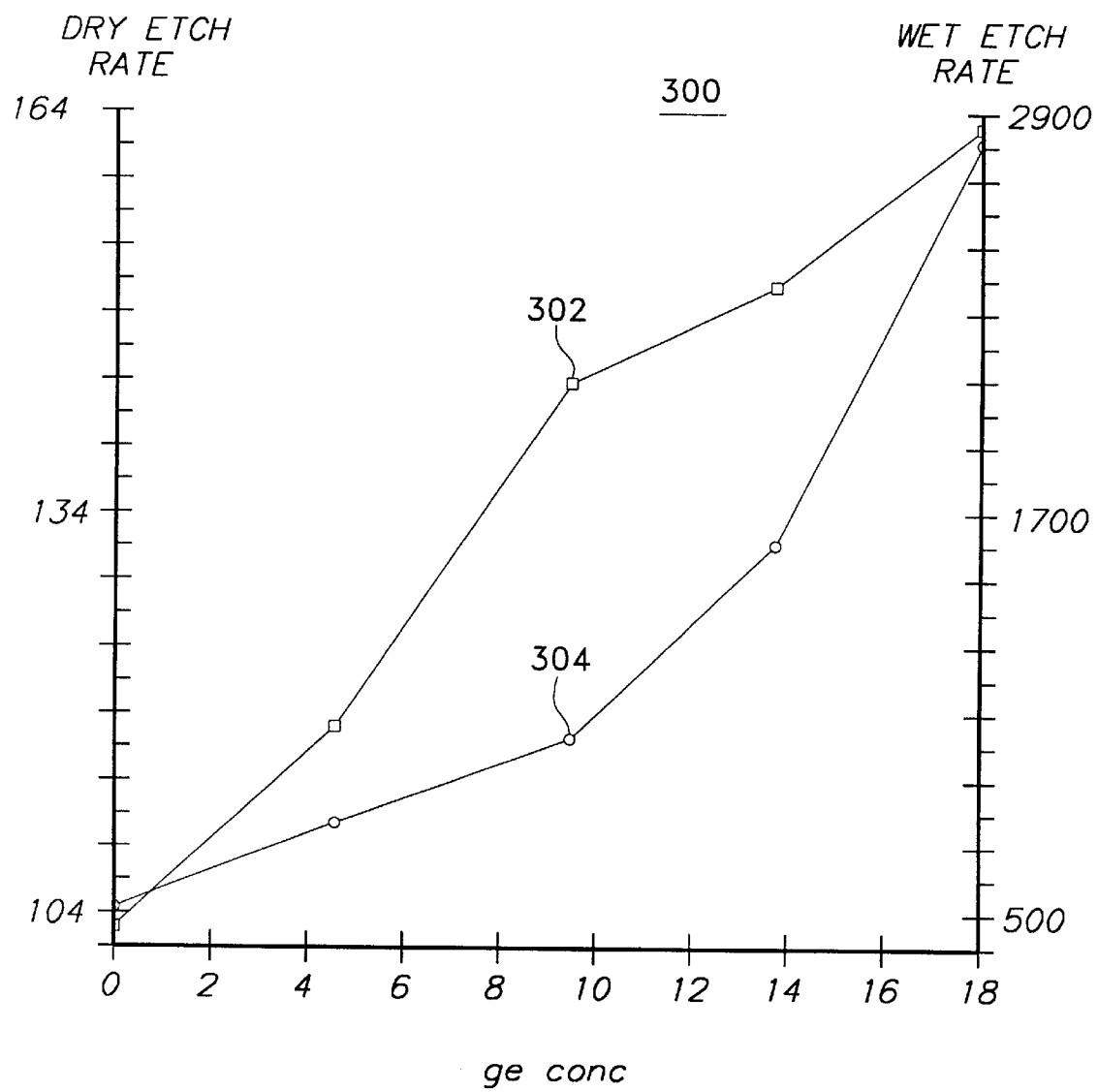
FIG. 3 shows a graphical representation of the way in which the relationships between the etch rate of the glass layer and the boron and phosphorus concentrations of a glass layer change as the germanium concentration changes.

Referring now to FIG. 3, there is shown a graphical representation 300 of experimental results illustrating the effect of increasing germanium concentration in the BPSG layer 40 in order to achieve a high etch rate of the layer 40. In the graphical representation 300 the line 302 represents the dry etch rate expressed in angstroms per second and the line 304 represents the wet etch rate expressed in angstroms per minute. The germanium concentration on the horizontal axis is expressed in percent. It will be seen from the graphical representation 300 that both the dry etch rate and the wet etch rate of BPSG increase substantially as the germanium concentration of the BPSG is increased from zero to eighteen percent.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A method of fabricating integrated circuits on a semiconductor substrate, comprising the steps of:
    (a) forming a conductor having a nitride encapsulating layer;
    (b) depositing a glass nonconducting layer doped with germanium over said conductor;
    (c) performing a self-aligned contact etch using said conductor; and
    (d) performing a selective etch wherein said selective etch preferentially removes material forming said germanium doped glass nonconducting layer faster than it removes said nitride encapsulating layer of said conductor.

2. The semiconductor fabrication method of claim 1, wherein said conductor comprises tungsten silicide.

3. The semiconductor fabrication method of claim 1, wherein said glass forming said nonconducting layer has a germanium concentration of at least approximately 25%.

4. The semiconductor fabrication method of claim 1, wherein said glass forming said nonconducting layer has a germanium concentration of at least approximately 10%.

5. The semiconductor fabrication method of claim 1, wherein said glass forming said nonconducting layer has a germanium concentration of at least approximately 5%.

6. The semiconductor fabrication method of claim 1, Wherein said glass forming said nonconducting glass layer is selected from the group consisting of SG, BPSG, BSG, PSG and TEOS.

7. The semiconductor fabrication method of claim 1, comprising the further steps of doping a region of said semiconductor substrate in the vicinity of said conductor to provide a doped semiconductor region.

8. The semiconductor fabrication method of claim 7, wherein the selective etch of step (d) is performed over said doped semiconductor region.

9. The semiconductor fabrication method of claim 8, wherein a conducting layer is disposed over said doped semiconductor region in electrical contact with said doped semiconductor region.

10. The semiconductor fabrication method of claim 9, wherein said conducting layer comprises aluminum.

11. The semiconductor fabrication method of claim 9, wherein said conducting layer comprises tungsten.

12. The semiconductor fabrication method of claim 1, wherein said nonconducting layer comprises approximately three to five percent boron and five to eight percent phosphorous.

13. The semiconductor fabrication method of claim 1, wherein step (d) comprises the step of removing said material forming said nonconductive layer at a rate fifty times higher than the rate of removing said material forming said encapsulating layer.

14. The semiconductor fabrication method of claim 1, wherein said nonconducting layer is doped with phosphorus.

15. The semiconductor fabrication method of claim 1, comprising the steps of polishing back said nonconducting layer using a CMP process stopped on said nitride layer and depositing a further nonconducting layer over said substrate.

16. A method of fabricating integrated circuits on a semiconductor substrate, comprising the steps of:
    (a) forming a tungsten silicide conductor having a nitride encapsulating layer;
    (b) depositing a glass layer doped with germanium over said tungsten silicide conductor;
    (c) performing a self-aligned contact etch using said tungsten silicide conductor; and
    (d) performing a selective etch wherein said selective etch preferentially removes material forming said nonconducting layer faster than it removes said nitride encapsulating layer of said tungsten silicide conductor.

17. The semiconductor fabrication method of claim 16, wherein said glass layer has a germanium concentration of at least approximately 25%.

18. The semiconductor fabrication method of claim 16, wherein said glass layer has a germanium concentration of at least approximately 5%.

19. The semiconductor fabrication method of claim 16, wherein said glass forming said glass layer is selected from the group consisting of SG, BPSG, BSG, PSB and TEOS.

20. The semiconductor fabrication method of claim 16, comprising the further steps of doping a region of said semiconductor substrate in the vicinity of said conductor to provide a doped semiconductor region wherein the selective etch of step (d) is performed over said doped semiconductor region.

* * * * *